United States Patent
Wu et al.

(10) Patent No.: US 7,641,468 B2
(45) Date of Patent: Jan. 5, 2010

(54) IMPRINT LITHOGRAPHY APPARATUS AND METHOD EMPLOYING AN EFFECTIVE PRESSURE

(75) Inventors: Wei Wu, Mountain View, CA (US);
William M. Tong, Oakland, CA (US);
Jun Gao, Mountain View, CA (US);
Carl Picciotto, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 646 days.

(21) Appl. No.: 10/931,672

(22) Filed: Sep. 1, 2004

(65) Prior Publication Data
US 2006/0043626 A1 Mar. 2, 2006

(51) Int. Cl.
*B29D 17/00* (2006.01)
(52) U.S. Cl. .................... 425/405.1; 425/353; 425/358; 425/385; 425/388; 425/394
(58) Field of Classification Search ............... 425/326.1, 425/327, 345, 346, 353, 358, 385, 388, 405.1, 425/394
See application file for complete search history.

(56) References Cited

U.S. PATENT DOCUMENTS

| | | | | |
|---|---|---|---|---|
| 3,225,461 | A * | 12/1965 | Snyder ........................ | 434/132 |
| 4,806,088 | A * | 2/1989 | Busch et al. ................. | 425/127 |
| 5,234,717 | A * | 8/1993 | Matsuno et al. .............. | 427/277 |
| 5,427,599 | A * | 6/1995 | Greschner et al. ............. | 65/305 |
| 5,772,905 | A * | 6/1998 | Chou .......................... | 216/44 |
| 5,863,452 | A * | 1/1999 | Harshberger et al. .......... | 249/83 |
| 5,947,027 | A * | 9/1999 | Burgin et al. ................ | 101/474 |
| 5,993,189 | A * | 11/1999 | Mueller et al. ............ | 425/405.1 |
| 6,062,133 | A * | 5/2000 | Blalock ....................... | 100/211 |
| 6,294,450 | B1 | 9/2001 | Chen et al. | |
| 6,309,580 | B1 | 10/2001 | Chou | |
| 6,365,059 | B1 | 4/2002 | Pechenik | |
| 6,407,443 | B2 | 6/2002 | Chen et al. | |
| 6,482,742 | B1 | 11/2002 | Chou | |
| 6,696,220 | B2 * | 2/2004 | Bailey et al. ................. | 425/385 |
| 6,719,915 | B2 * | 4/2004 | Willson et al. ................ | 216/44 |
| 6,799,438 | B2 * | 10/2004 | Herzbach et al. .............. | 65/25.3 |
| 6,994,541 | B2 * | 2/2006 | Chung et al. ............... | 425/385 |
| 7,117,790 | B2 * | 10/2006 | Kendale et al. ............. | 101/327 |
| 7,144,539 | B2 * | 12/2006 | Olsson ....................... | 264/293 |
| 7,204,686 | B2 * | 4/2007 | Chung et al. ................ | 425/385 |
| 7,270,533 | B2 * | 9/2007 | McMackin et al. ........ | 425/387.1 |
| 7,322,287 | B2 * | 1/2008 | Tan et al. ...................... | 101/28 |
| 7,323,130 | B2 * | 1/2008 | Nimmakayala et al. ..... | 264/319 |

(Continued)

FOREIGN PATENT DOCUMENTS

WO WO 02/07199 1/2002

(Continued)

OTHER PUBLICATIONS

U.S. Appl. No. 10/301,475, filed Sep. 11, 2003, Chou, Pat. App. Pub. US 2003/0170995.

(Continued)

*Primary Examiner*—Steven P Griffin
*Assistant Examiner*—Seyed Masoud Malekzadeh

(57) ABSTRACT

An imprint apparatus and method employ an effective pressure in imprint lithography. The imprint apparatus includes a compressible chamber that encloses an imprint mold having a mold pattern and a sample to be imprinted. The chamber is compressed to imprint the mold pattern on the sample. The mold is pressed against the sample with the effective pressure. The effective pressure is controlled by a selected ratio of a cavity area of the chamber to a contact area between the mold and the sample.

26 Claims, 8 Drawing Sheets

U.S. PATENT DOCUMENTS

| 2002/0132482 | A1* | 9/2002 | Chou | 438/692 |
| 2003/0006529 | A1* | 1/2003 | Ho et al. | 264/272.15 |
| 2003/0159608 | A1 | 8/2003 | Heidari | |

FOREIGN PATENT DOCUMENTS

| WO | WO 03/104898 | 12/2003 |
| WO | WO 2004/044654 | 5/2004 |
| WO | WO 2005/054948 | 6/2005 |
| WO | WO 2005/109095 | 11/2005 |

OTHER PUBLICATIONS

U.S. Appl. No. 10/301,476, filed Sep. 11, 2003, Chou, Pat. App. Pub. US 2003/0170996.

Doug Resnick et al., "Making an Imprint", SPIE OEMagazine, Aug. 2003, pp. 18-21.

D. J. Resnick et al., "Imprint Lithography for Integrated Circuit Fabrication", J. Vac. Sci. Technol., B 21(6), Nov./Dec. 2003, pp. 2624-2631.

R. Pelzer et al., "Nanoimprint Lithography—A Next Generation High Volume Lithography Technique", Presented at SEMICON China 2004, SEMI Technology Symposium, 5 pages.

Xing Chen et al., "One-step Lithography for Various Size Patterns with a Hybrid Mask-mold", Elsevier Microelectronic Engineering, 71, 2004, pp. 288-293.

* cited by examiner

IMPRINT LITHOGRAPHY APPARATUS AND METHOD EMPLOYING AN EFFECTIVE PRESSURE

BACKGROUND

1. Technical Field

The invention relates to semiconductors and the fabrication thereof. In particular, the invention relates to imprint lithography used to define one or both of micro-scale and nano-scale structures during semiconductor fabrication.

2. Description of Related Art

A relatively new lithographic methodology that attempts to address many of the challenges associated with practical implementation and commercial acceptance of nanotechnology is imprint lithography. Unlike conventional optical lithography that generally relies on indirect, mask-based patterning of samples or substrates during fabrication, imprint lithography directly patterns the substrate using a mold. Specifically, the mold is employed to 'print' a fabrication pattern directly onto the substrate. The mold may be fabricated using conventional lithographic methodologies and then is employed to rapidly 'print' one or more copies of the fabrication pattern onto a single substrate and/or onto multiple substrates.

Unfortunately, the practical use of imprint lithography has been limited by a need to align the mold with the substrate to be imprinted and then separately, typically in a different apparatus, imprint the mold pattern onto the substrate. For example, a conventional mask aligner may be employed to align the mold with the substrate. After alignment, the mold and the substrate are transferred to a press for imprinting. Such transfer of the aligned mold and substrate can and generally does adversely affect an accuracy of the alignment. In addition, imprint uniformity may be limited by both the transfer and an inability to accurately control a pressure with which the mold is pressed into the substrate by the press.

Accordingly, it would be desirable to have an approach to imprint lithography that did not require a transfer from one apparatus to another. Moreover, it would be beneficial if such approach to imprint lithography also maintained alignment accuracy and facilitated imprint uniformity. Such an imprint lithography approach would solve a long-standing need in the area of nanotechnology.

BRIEF SUMMARY

In some embodiments of the present invention, an imprint apparatus used in imprint lithography is provided. The imprint apparatus comprises a compressible chamber that encloses an imprint mold having a mold pattern and a sample to be imprinted. The chamber is compressed to imprint the mold pattern on the sample. The mold is pressed against the sample with an effective pressure, wherein the effective pressure is controlled by a selected ratio of a cavity area of the chamber to a contact area between the mold and the sample.

In other embodiments of the present invention, an imprint lithography system is provided. The imprint lithography system comprises a contact mask aligner and an imprint apparatus supported by the mask aligner. The mask aligner adjusts the imprint apparatus to align an imprint mold with a sample to be imprinted. The mold and sample are supported and housed within the imprint apparatus. The imprint apparatus imprints a mold pattern of the aligned mold in a surface of the aligned sample. The mold pattern is imprinted with an effective pressure by compressing the imprint apparatus. The effective pressure is controlled by a selected ratio of a cavity area of the imprint apparatus to a contact area between the mold and the sample.

In other embodiments of the present invention, a method of imprinting a pattern of a mold into a surface of a sample is provided. The method comprises applying an effective pressure to the mold and the sample to imprint the sample with the pattern of the mold. The effective pressure is controlled by selecting a ratio of a cavity area of a compressible chamber that houses the mold and the sample during imprinting to an area of contact between the mold and the sample.

Certain embodiments of the present invention have other features in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
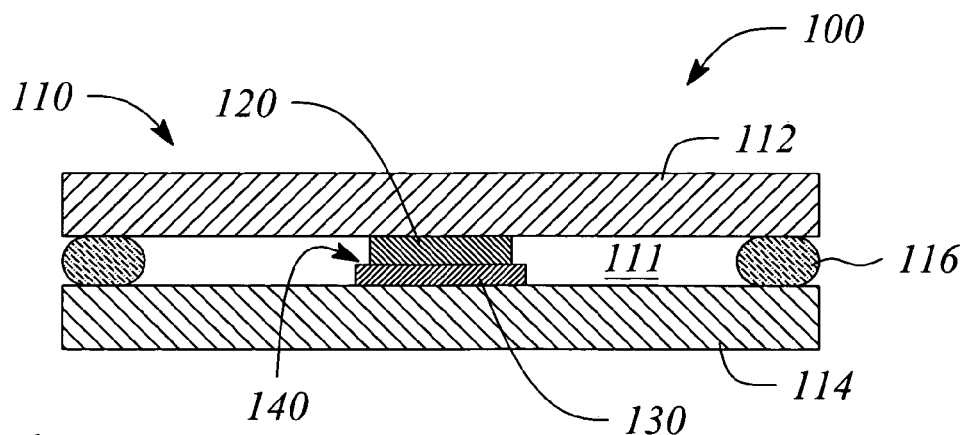
FIG. 1 illustrates a cross section of an imprint apparatus used in imprint lithography according to an embodiment of the present invention.

Embodiments of the present invention facilitate imprint lithography wherein a pattern defined by a mold is imprinted on or pressed into a surface of a substrate or sample. In particular, an effective pressure applied to an interface or contact between the mold and the sample presses at least one protruding feature of the mold pattern into a receiving surface of the sample, thereby uniformly creating a recess in the receiving surface. According to the embodiments of the present invention, the effective pressure is established, in part, by a predetermined or controlled area of contact between the mold and the sample and by an overall pressure applied to press the mold into the sample. Specifically, in some embodiments, the applied effective pressure may result from a difference in a pressure inside and a pressure outside of a compressible chamber that houses the mold and the sample. In such embodiments, the pressure difference acts on the compressible chamber to press the mold and the sample together uniformly across the contact area.

According to the embodiments of the present invention, essentially any arbitrary effective pressure may be established by selecting an appropriately sized contact area given a particular applied pressure or pressure difference. In particular, an effective pressure equal to or greater than about twice the applied pressure or pressure difference may be established. As such, the embodiments of the present invention facilitate direct control of the effective pressure through a predetermination of the contact area that is employed. By providing for such control of effective pressure, the embodiments of the present invention may ensure transfer of high quality, essentially uniform imprints of the pattern to the sample receiving surface. The embodiments of the present invention are generally applicable to imprint lithography used for semiconductor fabrication including, but not limited to, micro-imprint lithography, nano-imprint lithography and combinations thereof. A nano-scale structure resulting from nano-imprint lithography is one having dimensions that are often 50 to 100 times smaller than conventional, so-called 'micro-scale' structures resulting from micro-imprint lithography.

As used herein, imprint lithography generally involves imprinting a negative image of a pattern of the mold into a material of the sample that is relatively softer than the mold. The softer sample material receives and retains the imprinted pattern after the mold is removed and during further processing. A surface of the softer sample material of the sample that receives the mold during imprinting is referred to herein as the 'receiving surface' or 'receiving layer' of the sample. In some embodiments, the receiving surface or layer of the sample comprises a layer of the relatively softer material applied over a relatively harder substrate material of the sample. For example, the sample substrate may comprise one or more of a semiconductor material, a dielectric material, and metal material.

In some embodiments, the relatively softer material is cured or hardened during imprinting to facilitate retention of the imprinted pattern. Curing essentially 'freezes' or fixes the receiving layer in a shape or pattern determined by the mold. As used herein 'curing' generally includes any means of improving imprint retention especially that is selectively initiated or activated during imprinting.

For example, a layer of a photo-curable material such as, but not limited to a photo-activated monomer, oligomer, or polymer, (e.g., photoresist) that hardens when exposed to light (e.g., infrared, visible or ultraviolet (UV) illumination) may be used as the receiving layer. Prior to curing, the photo-curable material is soft (e.g., semi-liquid) and readily accepts the mold imprint pattern. Upon exposure to light, the photo-curable material cures around the mold. The cured photo-curable material thus retains the imprint pattern of the mold.

In another example, a thermoplastic material applied as a layer or film to a surface of the sample substrate is used as the receiving surface. Prior to imprinting, the thermoplastic material layer is heated to about a glass transition temperature of the material thereby softening the material. The mold is pressed into the softened material and the material is cooled to below the glass transition temperature causing the material to harden or cure around the impressed mold. The imprinted pattern is retained by the cured thermoplastic material. Examples of thermoplastic polymers that are used as the receiving layer include, but not limited to, polycarbonate, polymethylmethacrylate (PMMA) and methylmethacrylate (MMA).

A variety of applicable imprinting materials for both the sample substrate and the receiving surface are described in U.S. Pat. No. 6,294,450 to Chen et al., and U.S. Pat. No. 6,482,742 B1 to Chou, both of which are incorporated herein by reference. One skilled in the art is familiar with other materials, including other thermoplastic, photo-curable, and related materials, that are used or may be useful as the receiving surface for imprint lithography. All such materials are within the scope of the present invention.

In some embodiments, imprint lithography imprints a pattern having one or more of micro-scale and nano-scale features. An embodiment of the imprinting process of the present invention will be further described below with reference to FIGS. 6A-6E.

Figure 2:
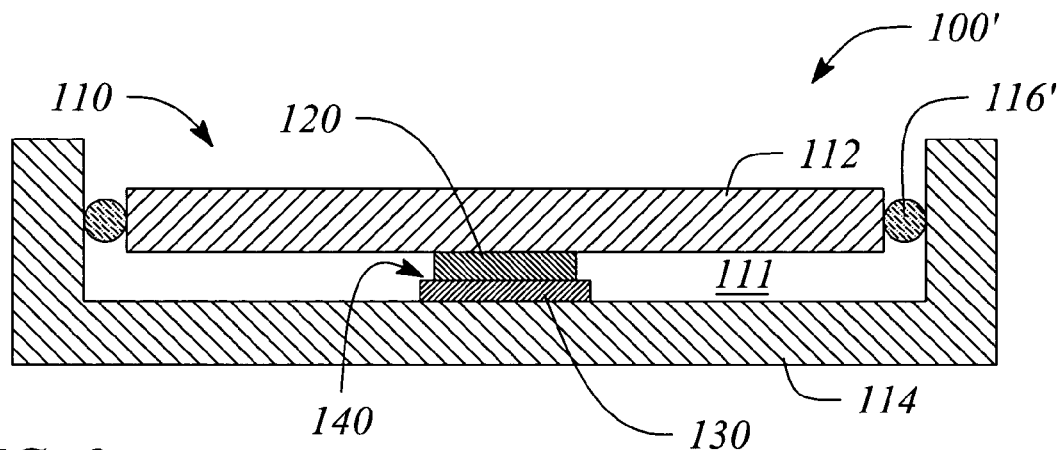
FIG. 2 illustrates a cross section of an imprint apparatus according to another embodiment of the present invention.

FIG. 1 illustrates a cross section of an imprint apparatus 100 used in imprint lithography according to an embodiment of the present invention. FIG. 2 illustrates a cross section of an imprint apparatus according to another embodiment of the present invention.

The imprint apparatus 100 comprises a compressible chamber 110 having a cavity 111. A mold 120 and a sample 130 are mounted within the compressible chamber 110 such that a compression thereof brings the mold 120 in contact with the sample 130. The mold 120 has a mold pattern in a surface of the mold 120 (that is illustrated with reference to FIG. 3). The sample 130 has a receiving surface that faces the mold 130 when installed in the chamber 110. Further compression of the chamber 110 presses the mold 120 into the sample 130 receiving surface, thereby imprinting the mold pattern onto the sample 130. As illustrated in FIG. 1, the mold 120 is both in contact with and pressed into the sample 130 by compression of the chamber 110.

The compressible chamber 110 is defined by a first or top member or plate 112, a second or bottom member or plate 114, and a gasket or seal 116. The top member 112 is spaced apart from the bottom member 114. The seal 116 bridges or spans a perimeter of the space between the members 112, 114, thereby 'completing' the compressible chamber 110. The completed compressible chamber 110 defines the cavity 111. One or both of the top member 112 and the bottom member 114 may be moveable relative to an external reference frame.

The chamber 110 is compressed by a relative motion of the top member 112 and the bottom member 114 toward one another.

In some embodiments, one or both of the members 112, 114 are optically transparent to facilitate optical alignment between the mold 120 and sample 130. Exemplary materials for the members 112, 114 include, but are not limited to, quartz, various types of glass, and silicon carbide (SiC). In some embodiments, only the top member 112 is transparent while the bottom member 114 has no specific transparency requirements. In such embodiments, the bottom member 114 may comprise essentially any material including, but not limited to silicon (Si), quartz, glass, gallium arsenide (GaAs), another semiconductor material, ceramic, and metal.

In general, the shape of the members 112, 114 is unimportant and is generally dictated by the specific application or environment (e.g., imprinting system, mold, sample, etc.). As such, the members 112, 114 may be round, square, hexagonal or essentially any other shape that accommodates the mold 120 and the sample 130. In some embodiments, symmetric shapes such as round or square plates are employed for the members 112, 114. Also, in some embodiments, the members 112, 114 have an essentially uniform thickness and each member 112, 114 provides at least one relatively flat surface to which the mold and sample are respectively mounted.

Figure 3:
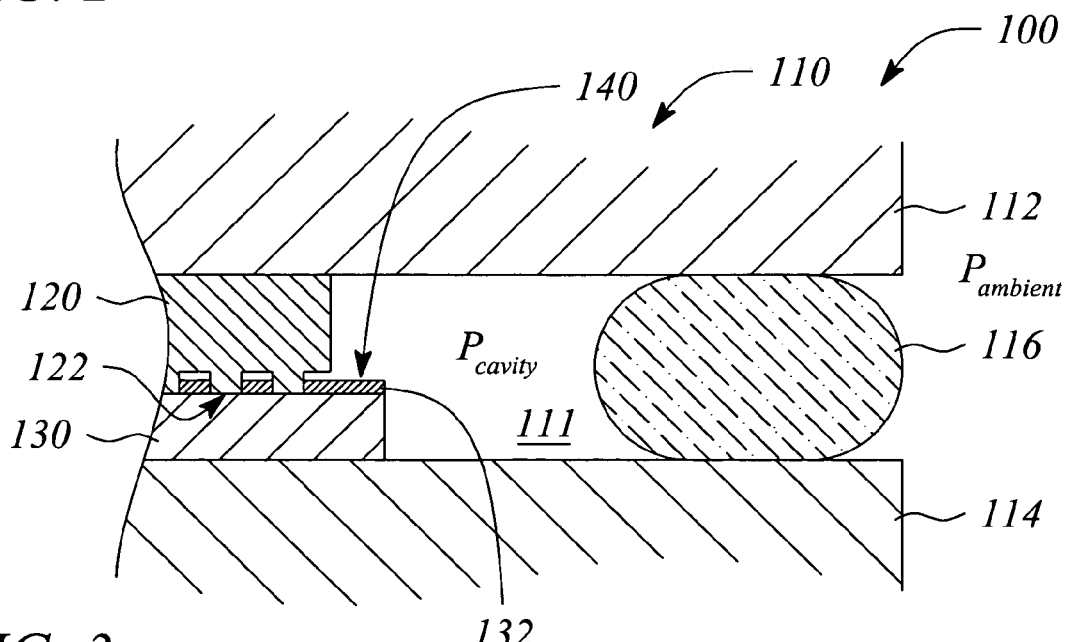
FIG. 3 illustrates in cross section an expanded view of a portion of the imprint apparatus illustrated in FIG. 1.

FIG. 3 illustrates in cross section an expanded view of a portion of the imprint apparatus 100 illustrated in FIG. 1. In particular, FIG. 3 illustrates a patterned surface 122 of the mold 120 in contact with and pressed into a moldable surface 132 of the sample 130 while the mold 120 and sample are within the compressed chamber 110 during an imprinting process. In addition, FIG. 3 illustrates compression of the gasket or seal 116 as a result of chamber 110 compression, wherein a cavity pressure $P_{cavity}$ is less than an ambient pressure $P_{ambient}$ external to or outside of the cavity of the chamber 110 during the imprinting process.

Generally, the gasket or seal 116 is essentially impermeable to one or both of gas and fluid (hereafter 'gas/fluid'). Thus, the seal 116 along with the top and bottom members 112, 114 of the compressible chamber 110 may serve to separate a gas/fluid within the cavity 111 of the chamber 110 from another gas/fluid outside the chamber 110. In particular, the gas/fluid within the chamber 110 may be at a pressure that differs from that of the gas/fluid outside the chamber 110. For example, the gas/fluid inside the chamber 110 may be air at a first pressure and the gas/fluid outside the chamber 110 may be air at a second pressure.

In some embodiments, the seal 116 comprises a compressible material or a semi-compressible material. In such embodiments, the compressible seal 116 readily compresses during compression of the chamber 110. For example, the seal 116 may comprise a material such as, but not limited to, silicone, latex, neoprene, and butyl rubber. In such embodiments, the compressible seal 116 may effectively define or delineate a side or sides of the compressible chamber 110 while the top member 112 and bottom member 114 form a top and a bottom of the chamber 110, respectively.

For example, the compressible seal 116 may comprise a silicone 'o-ring'. In another example, the seal 116 may be an elastomeric sheet having an opening or space cut in a central portion of the sheet to form a space for the cavity of the chamber 110. In another example, the seal 116 may be applied to one or both of the top member 112 and the bottom member 114 as a liquid or semi-liquid that is cured or 'hardened' once applied (e.g., silicone or acrylic caulking) to form the seal 116. In yet another example, the seal 116 may be made of a plurality of materials, some of which are compressible while others are essentially incompressible.

The seal 116 may be affixed to one of the members 112, 114 with an adhesive or another adhering means, or may be essentially free floating between the members 112, 114 until compressed. Alternatively, the seal 116 may be retained or positioned between the members 112, 114 in a groove or similar feature defined in an adjacent surface of one or both of the members 112, 114. Various embodiments of the compressible seal 116 are described in more detail herein below with reference to FIGS. 4, 5A and 5B.

Figure 4:
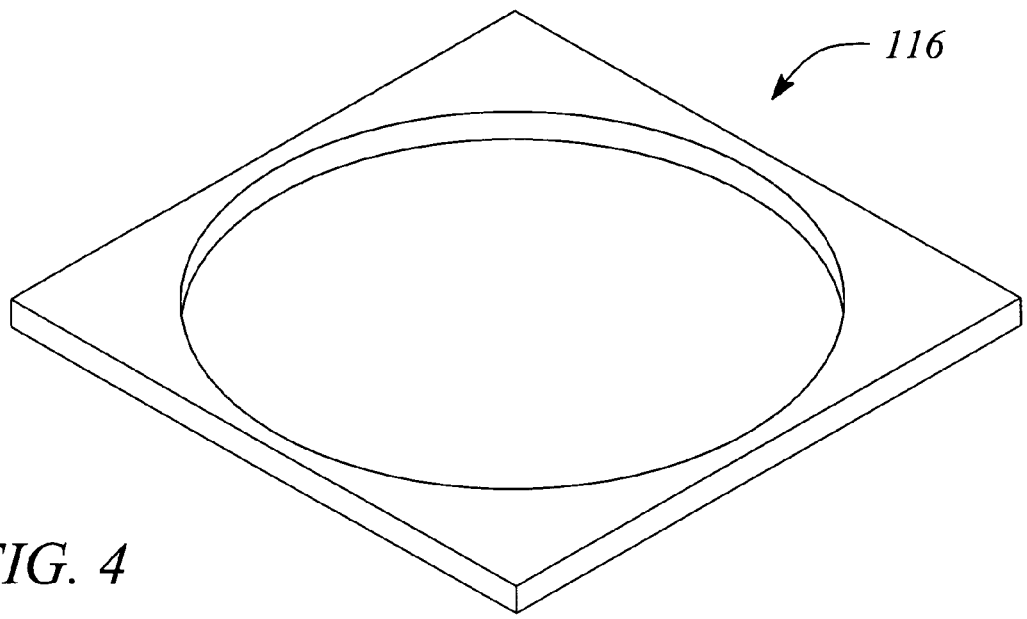
FIG. 4 illustrates a perspective view of an exemplary seal or gasket as a compressible, elastomeric sheet with an opening or space cut in a central portion according to an embodiment of the present invention.
Figure 5A:
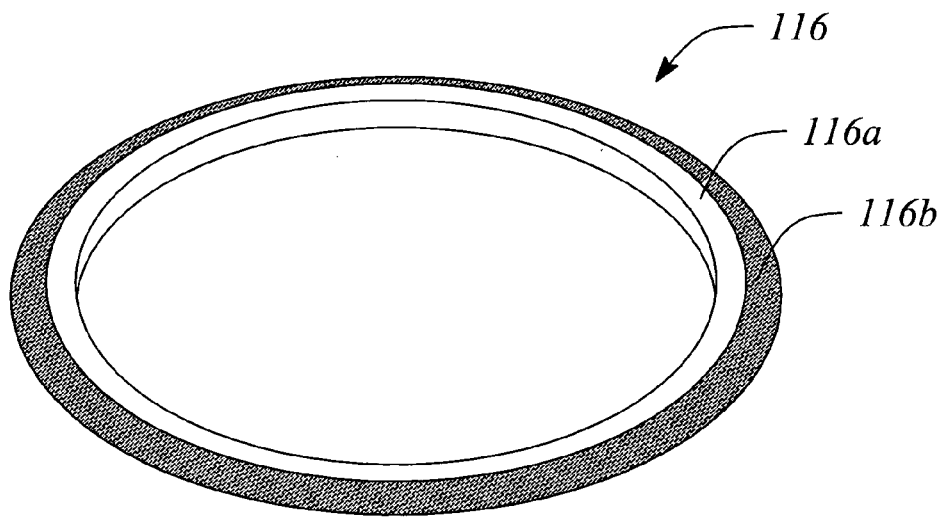
FIG. 5A illustrates a perspective view of an exemplary two-part seal or gasket according to an embodiment of the present invention.
Figure 5B:
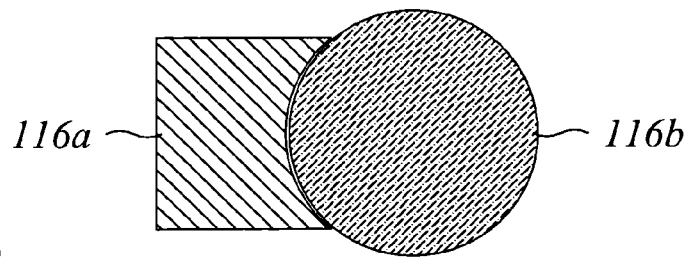
FIG. 5B illustrates a cross section of the two-part seal or gasket illustrated in FIG. 5A.

FIG. 4 illustrates a perspective view of an exemplary seal or gasket 116 as a compressible, elastomeric sheet with an opening or space cut in a central portion of the sheet according to an embodiment of the present invention. FIG. 5A illustrates a perspective view of an exemplary two-part seal 116 according to another embodiment of the present invention. FIG. 5B illustrates a cross sectional view of the two-part seal 116 illustrated in FIG. 5A. The two-part seal 116 comprises a rigid, essentially non-compressible inner ring or portion 116a and a compressible outer ring 116b. The inner ring or portion 116a supports the compressible outer ring 116b. In some embodiments, the inner ring 116a may prevent the outer ring 116b from collapsing when a difference in pressure inside and outside the chamber 110 exists or is applied. In general, the outer ring 116b is thicker than the inner ring 116a to facilitate compression of the chamber 110. While illustrated as being generally circular in FIGS. 5A- 5B, or having a circular opening in FIG. 4, the seal 116 and/or its central opening may have any shape.

In other embodiments, the seal 116' is essentially non-compressible. For example, the top member 112 and the bottom member 114 may be configured to nest inside one another as a piston nests inside a cylinder. In such embodiments, the seal 116' essentially slides on a surface of one or both of the top and bottom members 112, 114 during chamber 110 compression (e.g., rings of a piston), but does not itself compress. For example, FIG. 2 illustrates a cross section of such an imprint apparatus 100 with nesting top and bottom members 112, 114 and a substantially non-compressible seal 116'. One skilled in the art may readily recognize other compressible chamber configurations comprising one or more of a top member, a bottom member, and a seal, all of which are within the scope of the present invention.

The mold 120 provides a pattern that is to be imprinted during lithographic imprinting. As such, the mold 120 comprises a patterned side that defines the pattern being imprinted. In general, the pattern comprises at least one protruding feature. In general, the feature or features have dimensions consistent with one or both of micro-scale features and nano-scale features. A wide variety of mold materials are known including, but not limited to, semiconductors such as silicon (Si), germanium (Ge), and compound semiconductors such as gallium arsenide (GaAs), other materials such as silicon dioxide ($SiO_2$), silicon carbide (SiC), silicon nitride (SiN), sapphire, quartz, various metals, and combinations thereof.

For example, the mold 120 may be a substrate or wafer of silicon or quartz into which the pattern is defined. Pattern definition may be accomplished by any of various known techniques including, but not limited to, one or more of electron beam (e-beam) lithography, x-ray lithography, and etching using one or both of anisotropic and nonanisotropic etching techniques. Typical dry etching techniques include, but are not limited to, reactive ion etching (RIE) and plasma etching. Typical wet etching techniques include, but are not limited to, liquid-phase chemical etchants known to etch the material of the mold, such as potassium hydroxide (KOH) etching of silicon, or hydrofluoric acid (HF) etching of SiO$_2$, for example. The etched pattern may include both protruding and recessed features, for example. Information regarding forming a pattern in a mold and further details on molds and their use in imprinting lithography may be found in U.S. Pat. Nos. 5,772,905; 6,309,580; 6,294,450 and 6,407,443, all of which are incorporated herein by reference.

The sample 130 comprises a moldable surface that receives the pattern of the mold 120 during imprinting (also referred to herein as 'receiving surface'). In essence, imprinting transfers the pattern of the mold 120 to the moldable surface of the sample 130. In some embodiments, the moldable surface is a surface of the sample 130 coated with an imprintable or moldable layer or film. In some embodiments, heat and/or an illumination source (e.g., infrared, visible and/or UV light) may be employed during imprinting to cure or otherwise 'fix' the pattern in the moldable surface by hardening the surface. In some embodiments, the heat or illumination is employed to soften the moldable surface, and subsequent removal of the heat or illumination allows the moldable surface to re-harden (i.e., cure) and fix the pattern therein.

For example, the sample 130 may comprise a semiconductor wafer 130 such as a Si wafer. The semiconductor wafer 130 is coated on a surface with a resist material such as PMMA. The PMMA-coated surface serves as the moldable surface during imprinting. Heating the PMMA to about or just above a glass transition temperature softens the PMMA-coated surface rendering the surface moldable. The PMMA-coated surface is cured by cooling the PMMA to below the glass transition temperature. After curing in association with imprinting, the PMMA coated surface retains the imprint of the mold pattern for further processing of the semiconductor wafer 130.

Once the imprint apparatus 100 according to the present invention imprints the mold pattern, the imprinted pattern in the moldable surface 132 may be transferred into a material or materials of the sample 130 as a positive image of the mold pattern through further lithography and etching, for example. The process of imprint lithography is known in the art, as exemplified by the U. S. Patents cited supra. For example, the transfer of the pattern may be into one or both of a substrate of the sample 130 and a layer on a surface of the sample 130 between the moldable surface 132 and the sample 130 surface, such as a layer of a conductive material or a semiconductor material (i.e., transfer layer). In addition, the pattern so transferred may be used for further processing in the formation of nano-scale structures, such as nanowires.

Figure 6A:
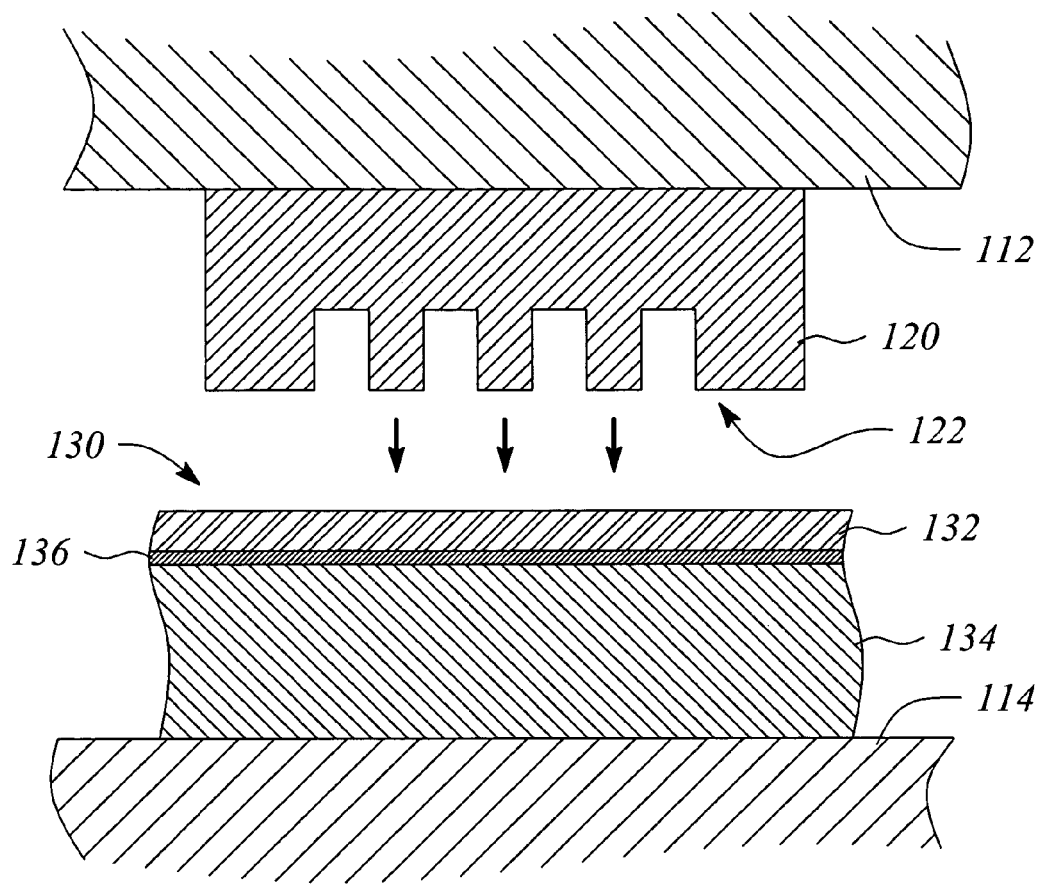
FIG. 6A illustrates a side view of an exemplary mold positioned for imprinting an exemplary sample according to an embodiment of the present invention.

FIG. 6A illustrates an exemplary mold 120 positioned for imprinting an exemplary sample 130 according to an embodiment of the present invention. As illustrated in FIG. 6A, the sample 130 comprises a substrate material 134 (e.g., silicon) coated with a transfer layer 136. In various embodiments, the transfer layer 136 may comprise one or more of a polymer layer, a dielectric layer, a polysilicon layer, a metal layer, and combinations thereof. Also illustrated is a relatively softer layer on top of the transfer layer 136 that acts as the moldable surface 132 to receive the pattern imprint. Arrows (in bold print) illustrated in FIG. 6A indicate motion of the mold 120 during imprint lithography. The exemplary mold 120 is affixed to the top member 112 while the sample 130 is affixed to the bottom member 114 of the imprint apparatus 100 and compressed, as described hereinabove with reference to FIGS. 1-3.

Figure 6B:
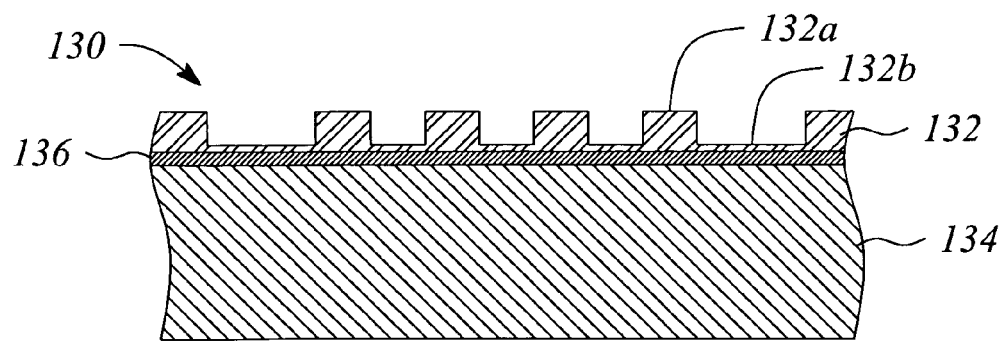
FIG. 6B illustrates a side view of the exemplary sample following imprinting by the exemplary mold illustrated in FIG. 6A.

FIG. 6B illustrates the exemplary sample 130 following imprinting by the exemplary mold 130 illustrated in FIG. 6A. As illustrated in FIG. 6B, features of the mold 120 pattern have been imprinted in the moldable surface 132. According to various embodiments of the present invention, the imprinting is provided by compression of the compressible chamber 110 of the imprint apparatus 100. The effective pressure afforded by the imprint apparatus 100 of the present invention ensures that a depth of the imprinted pattern is relatively uniform across the contact area.

There are many ways of transferring the imprinted pattern into the sample 130 during further processing. For example, the moldable surface 132 may be etched or otherwise processed to leave raised areas 132a and remove residual material in recessed areas 132b of the moldable surface 132. Such etching or processing may include, but is not limited to, dry etching and/or wet etching of the moldable surface 132.

Figure 6C:
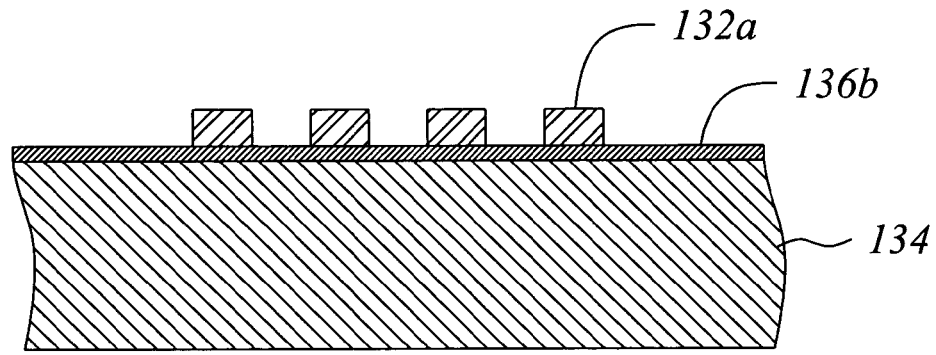
FIG. 6C illustrates a side view of the exemplary sample illustrated in FIG. 6B following removal of residual material of recessed areas of a moldable surface.

FIG. 6C illustrates the exemplary sample 130 illustrated in FIG. 6B following removal of residual material of the recessed areas 132b of the moldable surface 132. Selective removal of the residual material leaves some portions 136a of the transfer layer 136 'protected' while other portions 136b are exposed or unprotected. In particular, exposed portions 136b are created in locations where the residual material of the recessed areas 132b is removed. The exposed areas 136b of the transfer layer 136 may be etched using known methods while the remaining raised areas 132a of the moldable surface 132 acts as an etch mask.

Figure 6D:
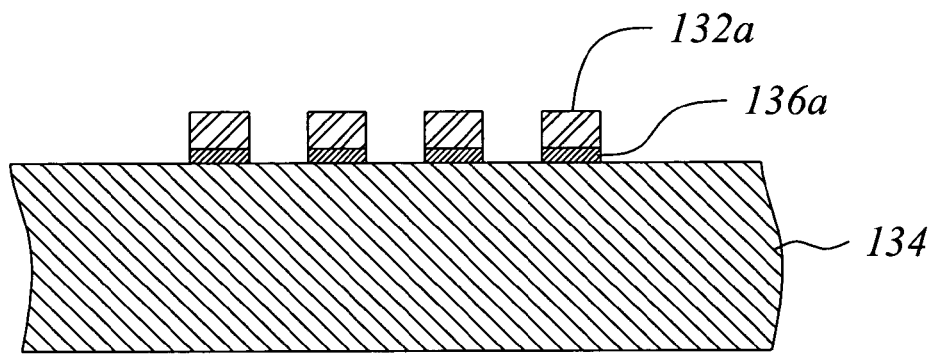
FIG. 6D illustrates a side view of the exemplary sample illustrated in the FIG. 6C following etching of exposed regions of a transfer layer.

FIG. 6D illustrates the exemplary sample 130 illustrated in FIG. 6C following etching of exposed regions 136b of the transfer layer 136. As illustrated in FIG. 6D, only the protected portions 136a of the transfer layer 136 remain after etching.

Figure 6E:
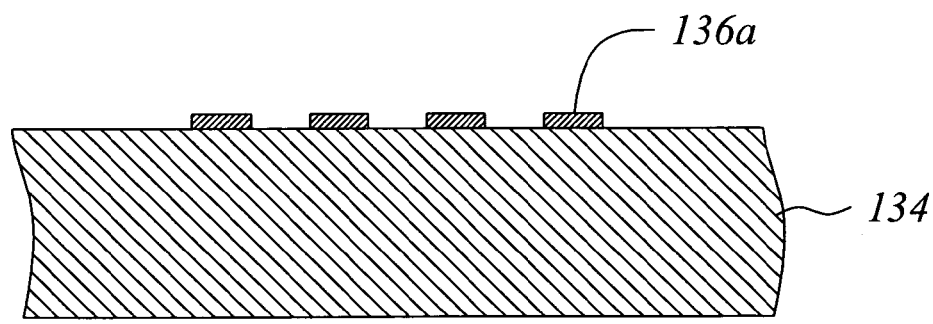
FIG. 6E illustrates a side view of the exemplary sample following removal of any remaining moldable surface material.

After the transfer layer 136 is etched, the remaining material of the moldable surface 132a is removed using known techniques. FIG. 6E illustrates the exemplary sample 130 following removal of any remaining moldable surface 132 material. The method of FIGS. 6A-6E described herein is exemplary and provided with the understanding that the embodiments of the present invention are not so limited to this described method of transferring a mold pattern to a sample.

As mentioned above, the mold 120 and the sample 130 are affixed to the respective chamber members 112, 114 of the imprint apparatus 100 for imprinting. For example, a side of the mold 120 opposite the patterned side 122 is adjacent to and in contact with the top member 112. A side of the sample 130 opposite the moldable surface 132 is adjacent to and in contact with the bottom member 114. The mold 120 may be affixed to the top member 112 using means for attaching including, but not limited to, an adhesive, such as an epoxy or glue, and a mechanical fastener, such as clips or screws, for example. Similarly, the sample 130 may be affixed to the bottom member 114 using similar means for attaching.

The means for attaching is firm or provides a firm attachment, such that the mold 120 and the sample 130 do not shift during imprinting. Depending on the embodiment, the means for attaching may be temporary or provides a temporary attachment, such that the mold 120 and the sample 130 are readily removable from the members 112, 114 of the chamber 110 after imprinting. The exemplary means for attaching listed above are not intended to limit the scope of the embodiments of the present invention in any way. Other means for attaching may be readily devised by one skilled in the art. These other means for attaching are within the scope of the embodiments of the present invention.

The top member 112 with the affixed mold 120 is aligned with the bottom member 114 with the affixed sample 120. Then the top member 112 and bottom member 114 are moved toward one another until the seal 116 contacts both a surface of the top member 112 and a surface of the bottom member 114 in some embodiments. Contact of the seal 116 to the top member 112 and bottom member 114 essentially forms the cavity 111. To imprint the mold pattern, the chamber 110 is then compressed to press the mold 120 into the sample 130.

In some embodiments, a pressure difference between a pressure inside the cavity 111 of the compressible chamber 110 and a pressure outside the chamber 110 is used to press the mold 120 into the sample 130. In particular, a cavity pressure $P_{cavity}$ within the cavity 111 less than an external or ambient pressure $P_{ambient}$ outside the cavity 111 produces a positive pressure difference $P_{diff}$ during imprinting in such embodiments.

For example, the cavity pressure $P_{cavity}$ may be approximately a vacuum (e.g., ~0 torr) while the external ambient pressure $P_{ambient}$ may be approximately one atmosphere (e.g., ~760 torr). The positive pressure difference $P_{diff}$ between the cavity pressure $P_{cavity}$ and the pressure outside the cavity $P_{ambient}$, acting through the structure of the chamber 110 (i.e., the top and bottom members 112, 114), causes the mold 120 to be pressed against the sample 130 at a mold/sample interface 140 with an effective pressure $P_{eff}$. The effective pressure $P_{eff}$ is a product of the pressure difference $P_{diff}$ and a ratio of a cavity area $A_{cavity}$ to a contact area $A_{contact}$. In particular, the effective pressure $P_{eff}$ exerted by the imprint apparatus 100 on the mold/sample interface 140 is given by $$P_{eff} = \frac{A_{cavity}}{A_{contact}}(P_{ambient} - P_{cavity}) \quad (1)$$

where the contact area $A_{contact}$ is an area of contact between the mold 120 and the sample 130 and the cavity area $A_{cavity}$ is an internal area of the chamber 110 defined by the members 112, 114 and the seal 116.

Thus, according to the present invention, the effective pressure $P_{eff}$ applied by the imprint apparatus 100 to press the mold 120 into the sample 130 is controllable by both the pressure difference (i.e., $P_{diff}=P_{ambient}-P_{cavity}$) and the ratio of the cavity area $A_{cavity}$ to the contact area $A_{contact}$. Even when the pressure difference $P_{diff}$ is essentially dictated by an environment in which the imprint apparatus 100 is used, the effective pressure $P_{eff}$ may be arbitrarily determined or established by controlling the ratio of the cavity area $A_{cavity}$ and the contact area $A_{contact}$. In some embodiments, the cavity area $A_{cavity}$ is determined as an area bounded or encompassed by the seal 116.

For example, the imprint apparatus 100 may be employed in conjunction with a conventional contact mask aligner system (not illustrated) for imprint lithography. The mask aligner is first used to align the mold 120 and the sample 130. In this example, the top member 112 of the compressible chamber 110 may be or comprise a mask blank 112 of the mask aligner, while the bottom member 112 of the compressible chamber 110 may be or comprise a substrate carrier 114 of the mask aligner.

Following alignment of the mold 120 to the sample 130 using the contact mask aligner, according to various embodiments of the present invention, an approximate vacuum is established in a vicinity of the imprint apparatus 100. In some embodiments, the established approximate vacuum surrounds the mask blank 112 and substrate carrier 114 while the mold 120 and the sample 130 are aligned and brought in contact with one another. As the mold 120 is brought into contact with the sample 130 by the mask aligner, the seal 116 contacts both the mask blank 112 and the sample carrier 114, thereby completing or closing the compressible chamber 110. The cavity 111 essentially 'traps' the vacuum within the chamber 110.

The vacuum external to the chamber 110 is then released to re-establish the ambient pressure $P_{ambient}$ outside the chamber 110 (e.g., $P_{ambient}$~760 torr) while leaving a vacuum inside the chamber 110 (i.e., $P_{cavity}$~0 torr in the cavity 111). Imprinting then proceeds with the effective imprint pressure $P_{eff}$ given by equation (1). Typically, one or more of heat and light (e.g., infrared, visible, and/or UV light, for example) may be applied during imprinting to facilitate transfer of the pattern to the moldable surface 132 around the mold 120.

Figure 7A:
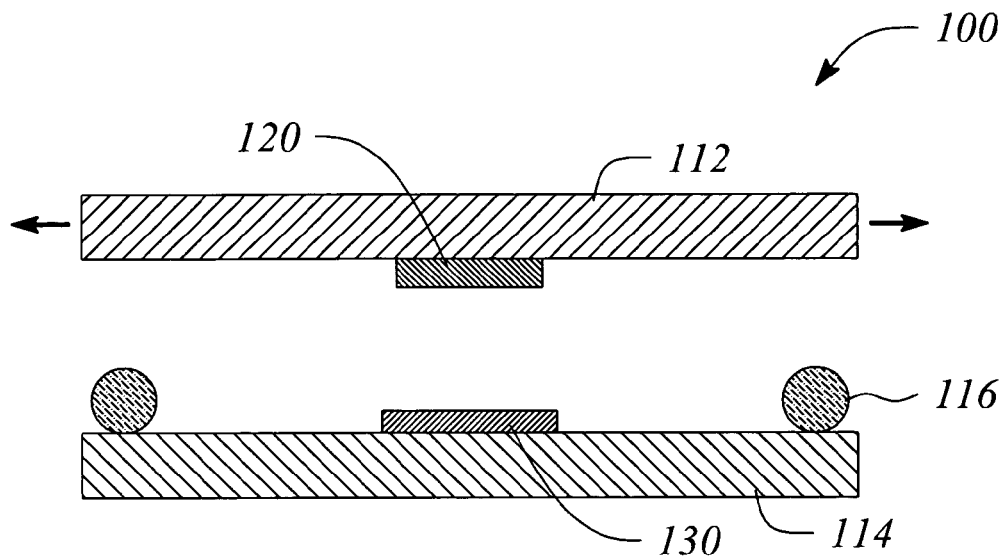
FIG. 7A illustrates a side view of the imprint apparatus during alignment of a mold and a sample according to an embodiment of the present invention.

FIGS. 7A-7D illustrate the process of aligning and imprinting the sample 130 using the imprint apparatus 100 according to an embodiment of the present invention. FIG. 7A illustrates the imprint apparatus 100 during an alignment of the mold 120 and sample 130 according to an embodiment of the present invention. In particular, the top member 112 with the mold 120 affixed thereto is illustrated above and separated from the bottom member 114 with the affixed sample 130. Arrows (in bold print) indicate movement of the top member 112 and mold 120 during alignment according to this embodiment.

Also illustrated in FIG. 7A is the seal 116 adjacent to or in contact with the bottom member 114 according to this embodiment. In other embodiments, the alignment may be facilitated by movement of the bottom member 114 either in addition to or alternatively to the top member 112 movement. Moreover, in other embodiments, the seal 116 may be adjacent or contacted to the top member 112 instead of the bottom member 114. Also, alignment movement is not limited to the directions illustrated by arrows in FIG. 7A. The alignment movement may include one or more directions into or out of a plane of the page of FIG. 7A, rotational movement, and up and down movement directions, as well as the illustrated side to side movement. It should be noted also that the top member 112 may support the sample 130 and the bottom member 114 may support the mold 120, instead of that illustrated, and still be within the scope of the various embodiments of the present invention.

Figure 7B:
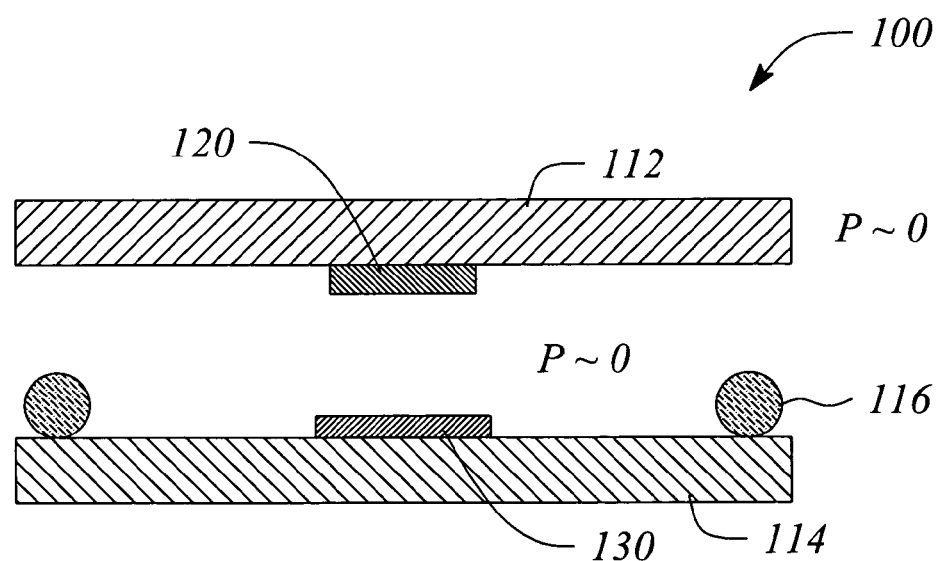
FIG. 7B illustrates a side view of the imprint apparatus during establishment of an approximate vacuum in a vicinity of the apparatus after alignment according to an embodiment of the present invention.

FIG. 7B illustrates the imprint apparatus 100 during establishment of an approximate vacuum in a vicinity of the apparatus 100 after alignment according to an embodiment of the present invention. Note that while alignment is described herein as preceding establishment of the vacuum, the alignment may be performed concomitant with or following the vacuum establishment and still be within the scope of the present invention.

Figure 7C:
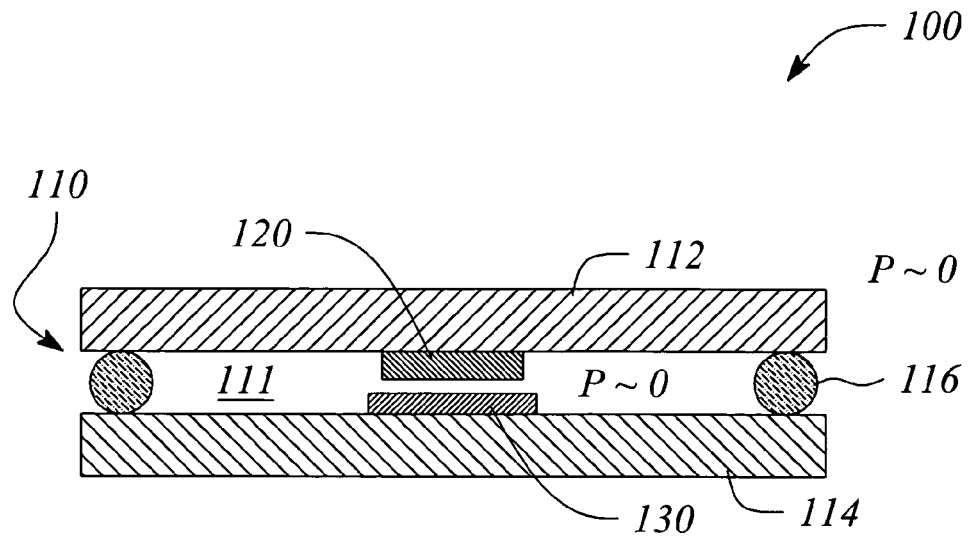
FIG. 7C illustrates a side view of the imprint apparatus being sealed according to an embodiment of the present invention.

FIG. 7C illustrates the imprint apparatus 100 being sealed according to an embodiment of the present invention. In other words, the compressible chamber 110 is formed and closed off from the external environment, thereby defining the cavity 111. In particular, to seal the imprint apparatus 100, in this illustrated embodiment, the top member 112 is brought into contact with the seal 116 that is contacted with the bottom member 114 to form the compressible chamber 110. The imprint apparatus 100 is sealed with the vacuum in place both inside the cavity 111 and outside the chamber 110. In some embodiments, the mold 120 affixed to the top member 112 may contact the sample 130 when the seal is formed. In other embodiments, the mold 120 may be spaced apart from the sample 130 when the seal is first formed, as illustrated in FIG. 7C.

Figure 7D:
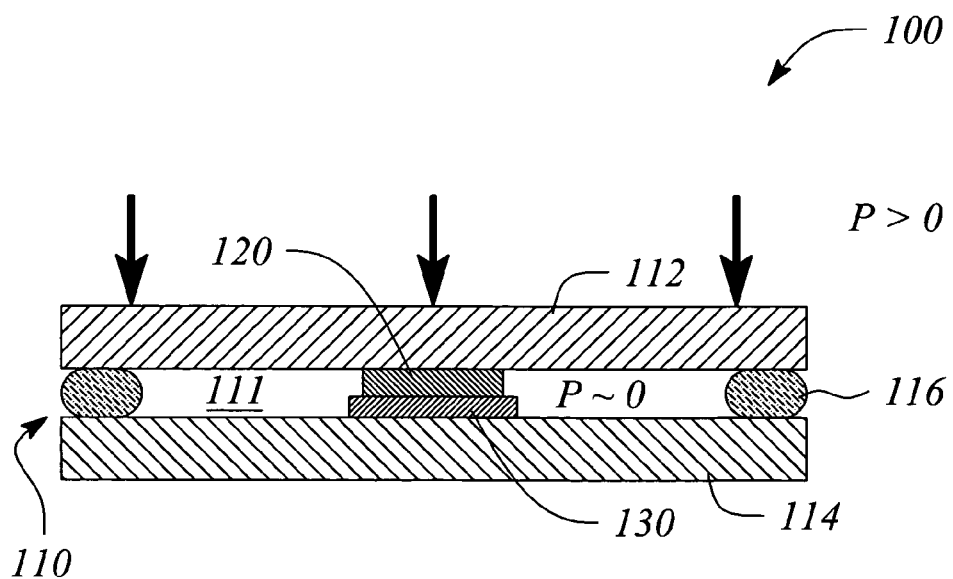
FIG. 7D illustrates a side view of a release of the vacuum outside the imprint apparatus according to an embodiment of the present invention.

FIG. 7D illustrates a release of the vacuum outside the imprint apparatus 100 according to an embodiment of the present invention. Release of the vacuum re-establishes the ambient pressure $P_{ambient}$ outside of the compressible chamber 110 of the apparatus 100 that differs from the vacuum retained inside the cavity 111 of the chamber 110. The pressure difference $P_{diff}$ between the cavity pressure $P_{cavity}$ inside the compressible chamber 110 and the ambient pressure $P_{ambient}$ outside the chamber 110 results in a force being applied to the members 112, 114 as indicated by the arrows in bold print in FIG. 7D. Although not illustrated with arrows, a force may be applied against the member 114 in addition to or alternatively to the force illustrated as applied against the member 112.

The applied force moves the members 112, 114 toward one another thereby compressing seal 116 and, in turn, compressing the chamber 110. Compression of the chamber 110 presses the mold 120 into the sample 130 to imprint the sample 130 with the pattern of the mold 120. As described hereinabove, an effective pressure with which the mold 120 is pressed into the sample 130 is controlled as given by equation (1). In other words, the effective pressure is proportional to or a function of a selected or predetermined ratio of cavity area to contact area and the pressure difference between inside and outside of the chamber 110.

Any one or more of the parameters, such as the inside cavity pressure $P_{cavity}$, the outside cavity pressure $P_{ambient}$, the contact area $A_{contact}$ and the cavity area $A_{cavity}$ may be manipulated to control the effective pressure $P_{eff}$ that is used to press the pattern of the mold 120 into the sample 130. However, in some embodiments, the outside cavity pressure $P_{ambient}$ is atmospheric pressure and the cavity pressure $P_{cavity}$ is essentially a vacuum. In such embodiments, the ratio of contact area $A_{contact}$ to cavity area $A_{cavity}$ is primarily used to control the effective pressure $P_{eff}$. For example, the cavity area may be controlled simply by adjusting or predetermining a size of the central opening in the seal 116, such that the size of the members 112, 114 may remain constant. Furthermore, such alignment and controllability facilitate achieving uniformly applied pressure throughout the contact area $A_{contact}$ between the mold 120 and the sample 130 contacted surfaces. The uniformity and its control are often important for imprint mold patterns that include micro-scale and nano-scale features, since errors in the alignment or the uniformly applied pressure may be pronounced or significant for patterns of nano-scale and micro-scale dimensions as compared to patterns of larger feature dimensions.

Figure 8:
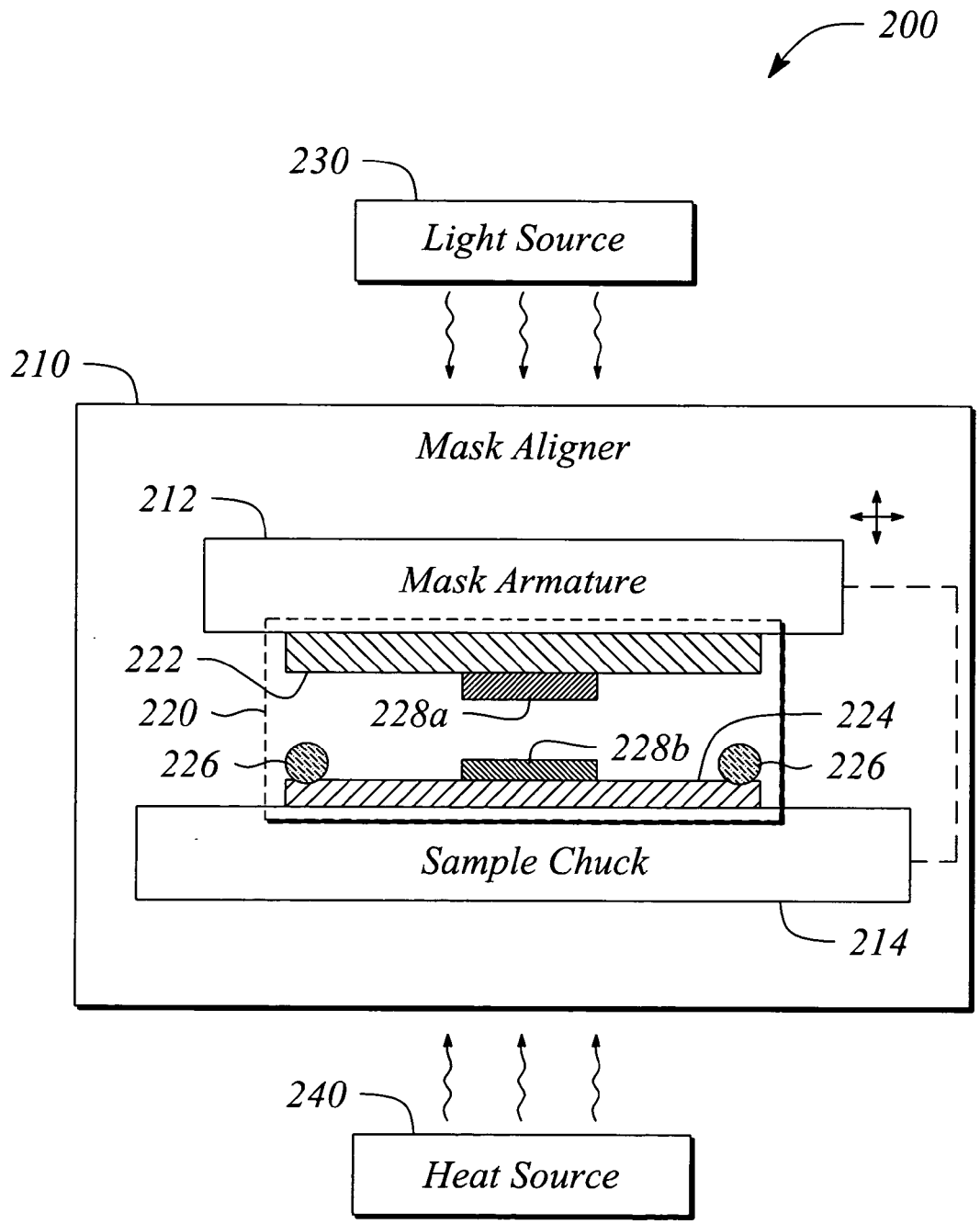
FIG. 8 illustrates a block diagram of an imprint lithography system according to an embodiment of the present invention.

FIG. 8 illustrates a block diagram of an imprint lithography system 200 according to an embodiment of the present invention. In particular, the imprint lithography system 200 provides both alignment between a mold and a sample to be imprinted and imprinting of the sample with a mold pattern defined in the mold. Furthermore, the imprint lithography system 200 accomplishes both the alignment and the imprint in a single setup or apparatus without a need to remove and/or transfer the mold and the sample after alignment from one setup or apparatus to another for imprinting, as in conventional systems.

The imprint lithography system 200 comprises a contact mask aligner 210 and an imprint module or apparatus 220. The contact mask aligner 210 holds the imprint module 220 during both alignment and imprinting. The contact mask aligner 210 comprises a mask armature 212 and a sample chuck or stage 214. In particular, the contact mask aligner 210 may be a conventional mask aligner with a substrate chuck or stage for holding a sample and a mask armature for holding a mask blank. In the conventional mask aligner, the mask armature and the substrate chuck are movable relative to one another enabling the mask blank to be aligned to (e.g., x-y and/or rotational ($\omega$) alignment) and then placed in contact (e.g., z-motion) with the sample. However, the mask aligner 210 of the present invention differs from the conventional mask aligner in that the mask aligner 210 holds or supports the imprint module 220 of the present invention for imprinting, which is further described below.

The imprint module 220 comprises a mask blank 222, a sample carrier 224, and a seal or gasket 226. In some embodiments, the mask blank 222 is a rigid or semi-rigid plate that provides a mounting surface for an imprint mold 228a. In such embodiments, the mold 228a may be removably affixed to the mounting surface of the mask blank 222 using an adhesive or a mechanical fastening means, for example. In other embodiments, the imprint mold 228a may be formed in or is fabricated as part of the mask blank 222.

The sample carrier 224 is a rigid or semi-rigid plate that provides a mounting surface for a sample 228b to be imprinted. In some embodiments, the sample 228b is removably affixed to the mounting surface of the sample carrier 224. For example, an adhesive or a mechanical fastening means may be employed to affix the sample 228b to the sample carrier 224. In other embodiments, the sample 228b itself may act as the sample carrier 224. For example, the sample 228b may be a portion of a larger wafer acting as the sample carrier 224. The gasket 226 is positioned between the mask blank 222 and the sample carrier 224 and provides a compressible, essentially gas/fluid tight seal therebetween during imprinting using the system 200.

In some embodiments, the imprint module 220 is essentially similar to the imprint apparatus 100 described hereinabove. In such embodiments, the mask blank 222 is essentially similar to the top member 112, the sample carrier 224 is essentially similar to the bottom member 114, and the gasket 226 is essentially similar to the seal 116 described herein above with respect to the imprint apparatus 100. Likewise, the mold 228a and the sample 228b are essentially similar to the mold 120 and the sample 130, respectively.

The mask aligner 210 initially holds the imprint module 220 as two separated or spaced apart sections or parts dictated by the relative positions of the mask armature 212 and sample chuck 214. In particular, the mask blank 222 and the affixed mold 228a are held by the mask armature 212 of the mask aligner 210 while the sample carrier 224 and the affixed sample 228b are seated in and held by the sample chuck 214. The gasket 226 may be affixed to either the mask blank 222 or the sample carrier 224.

FIG. 8 illustrates the gasket 226 adjacent to or on the sample carrier 224 by way of example. The initial spacing dictated by the mask aligner 210 facilitates alignment of the mold 228a and sample 228b using a conventional operation of the mask aligner 210 in a way similar to mask alignment known in the art. In some embodiments, the mounting surface of the mask blank 222 and the mounting surface of the sample carrier 224 are essentially parallel to one another when so held by the mask aligner 210. In other embodiments, the mounting surfaces are brought into parallel by adjusting one or both of the mask aligner 210 plates 212, 214 and the imprint module 220 plates 222, 224.

Once aligned, the mask armature 212 and the sample chuck 214 are moved toward one another to bring the mask blank 222 in contact with the gasket 226 on the sample carrier 224. Contact of the mask blank 222 and the sample carrier 224 with the gasket 226 forms a chamber having an internal cavity and a seal 226. The seal 226 separates the formed internal cavity within the imprint module 220 from a region surrounding the imprint module 220 within the mask aligner 210. In some embodiments, the chamber having an internal cavity is similar to the compressible chamber 110 and cavity 111 described above for the imprint apparatus 100. Moreover, in some embodiments, the mask aligner 210 comprises means for supporting a vacuum in a vicinity of the imprint module 200, as further described below. Such means for supporting includes, but is not limited to a compartment or enclosure that separates an internal environment adjacent to the imprint module 220 from an external environment of the mask aligner 210, at least temporarily to support the vacuum.

The movement of the mask armature 212 and the sample chuck 214 may comprise moving one or both of the armature 212 and the chuck 214 relative to a reference frame of the mask aligner 210. Such movement is consistent with conventional operation of a mask aligner that brings an aligned mask in contact with a resist covered substrate. With respect to the imprint module 220, a relative alignment of the mold 228a and the sample 228b achieved by the mask aligner 210 is generally maintained while the mask armature 212 and the sample chuck 214 are moved toward one another.

In some embodiments, an approximate vacuum is established in a vicinity of the mask blank 222 and sample carrier 224 prior to forming the seal 226 (e.g., with the means for supporting a vacuum). Once the seal 226 is formed, the vacuum is released in the region of the mask aligner 210 outside of the formed chamber of the imprint module 220. A pressure difference between the region outside and a region inside the chamber cavity of the imprint module 220 applies a force to the imprint module 220 such that the cavity is compressed and the aligned mold 228a is pressed into the aligned sample 228b. An effective pressure with which the mold 228a is pressed into the sample 228b is controlled by a combination of the pressure difference and a ratio of an area of contact between the mold 228a and sample 228b to an area of the cavity within the imprint module 220. In some embodiments, the effective pressure is given by equation (1) described hereinabove.

In some embodiments, one or both of the mask blank 222 and the sample carrier 224 are essentially transparent to light to facilitate photo-curing or to facilitate photo-softening of a moldable layer on a surface of the sample 228b. In such embodiments, the imprint lithography system 200 further comprises a light source 230 (e.g., infrared, visible, and/or UV light). In other embodiments, the moldable layer on the sample 228b is cured using heat or softened using heat followed by cooling. In such embodiments, the imprint lithography system 200 further comprises a heat source 240 that applies heat for the moldable layer during imprinting. In some embodiments, the imprint lithography system 200 comprises both a light source 230 and a heat source 240 enabling one or both of heat curing/softening and photo-curing/softening of the moldable layer, depending on the embodiment of the moldable layer used. Thus, the imprint lithography system 200 is essentially a turn-key system that provides alignment, imprinting and curing in a single setup. Further, a controllable pressure, facilitated by the features of the imprint module 220, provides uniform imprinting of the mold pattern.

Figure 9:
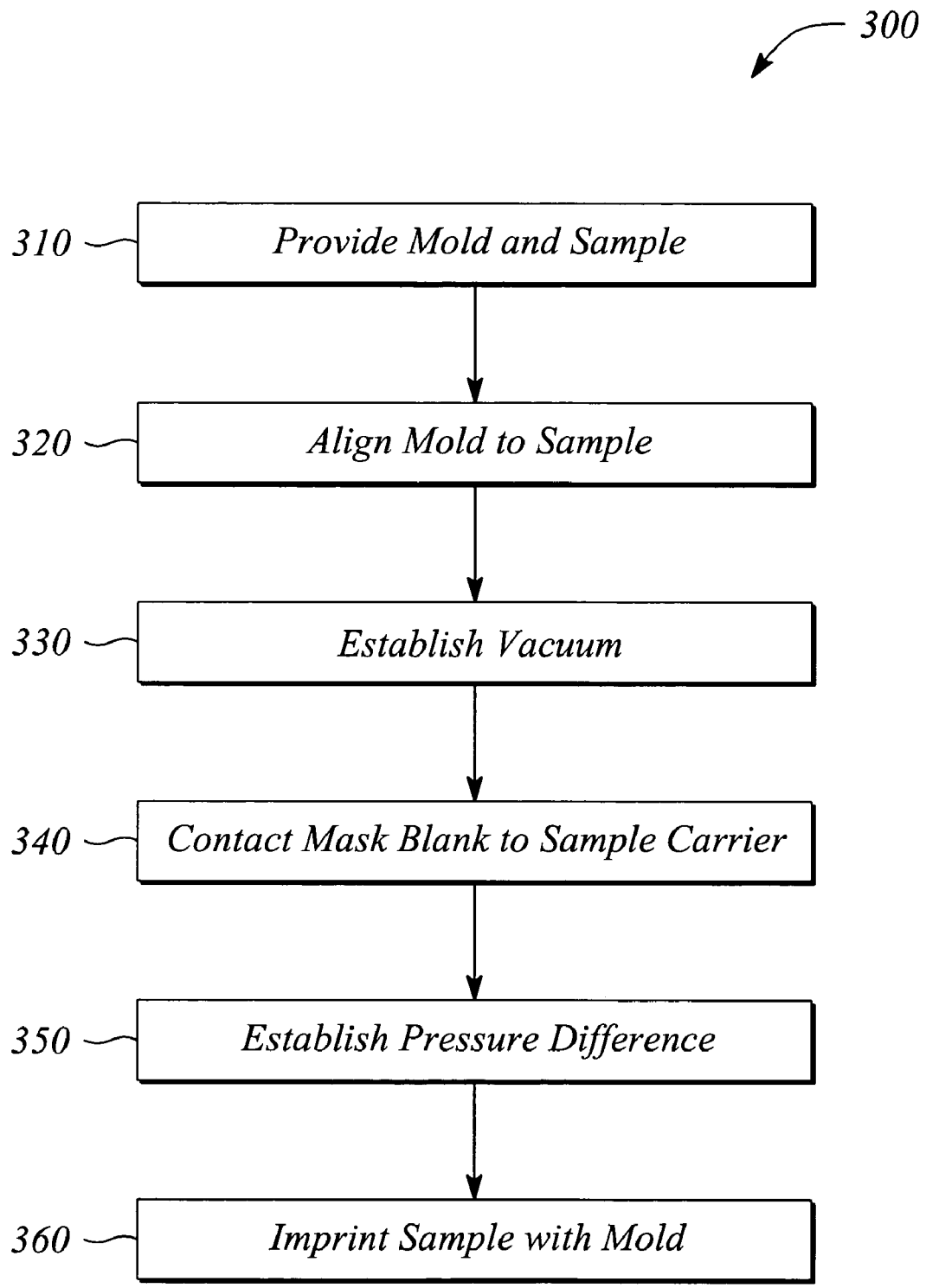
FIG. 9 illustrates a flow chart of a method of imprinting a pattern of a mold into a surface of a sample according to an embodiment of the present invention.

FIG. 9 illustrates a flow chart of a method 300 of imprinting a pattern of a mold into a surface of a sample according to an embodiment of the present invention. The method 300 employs a selected or predetermined ratio of an area of a cavity of a compressible chamber to an area of contact between the mold and the sample to control an effective pressure with which the mold is pressed into the sample. In particular, by selecting a specific ratio of such areas, the effective pressure may be controlled essentially arbitrarily according to the method 300 of the present invention.

The method 300 of imprinting comprises aligning 320 a mold to a sample. The mold is affixed to a mask blank and the sample is affixed to a sample carrier. The mold comprises a pattern defined in a surface of the mold that is to be imprinted and the sample comprises a moldable layer that receives the pattern to be imprinted. In some embodiments, the mold and the sample are aligned 320 in an x-y plane while being held spaced apart from one another along a z-axis perpendicular to the x-y plane by the mask blank and the sample carrier, respectively. In some embodiments, aligning 320 comprises moving one or both of the mask blank and the sample carrier in the x-y plane.

In some embodiments, the method 300 of imprinting further comprises providing 310 the mold and the sample. Providing 310 may comprise fabricating the mold pattern in a surface of the mold. Providing 310 may further comprise preparing the sample with a moldable layer and optionally, with a transfer layer. In some embodiments, the method 300 further comprises one or both of affixing the mold to the mask blank and affixing the sample to the sample carrier before aligning 320.

The method 300 of imprinting further comprises establishing 330 an approximate vacuum in a vicinity of and surrounding both of the mask blank and sample carrier. In other words, a gas/fluid pressure adjacent the mold and the sample is evacuated. The method 300 further comprises contacting 340 the mask blank and the sample carrier to a seal gasket therebetween to create an essentially gas/fluid tight, compressible chamber with an internal cavity formed by the mask blank, the sample carrier and the seal. Contacting 340 while the gas/fluid pressure is evacuated encloses the mold and the sample within the compressible chamber at essentially vacuum pressure. The seal effectively separates an internal portion or cavity of the chamber at essentially vacuum pressure from a region outside of the chamber.

The method 300 of imprinting further comprises establishing 350 a pressure difference between a pressure of the internal cavity and a pressure of the region outside of the compressible chamber. In some embodiments, the pressure difference is established 350 by releasing the vacuum outside of the cavity and re-establishing an ambient pressure of the outside region.

The method 300 of imprinting further comprises imprinting 360 the sample with the mold using an effective pressure that is a function of a selected ratio between an area of contact between the mold and the sample to a cavity area of the compressible chamber. In some embodiments, the contact area is an area that the mold and the sample are interfaced during imprinting 360. In some embodiments, the cavity area is determined by an internal area bounded by the compressible gasket or seal, the mold blank and the sample carrier. In some embodiments, the effective pressure is further a function of the pressure difference. In particular, the pressure difference applies a force to compress the seal/gasket and therefore, compress the chamber. The compression of the chamber, in turn, presses the mold into the sample thus imprinting 360 the sample with the mold pattern. The ratio is selected to control the effective pressure given the pressure difference. In some embodiments, the effective pressure of imprinting is given by equation (1) described hereinabove. In some embodiments, the contact area is less than one half of the cavity area, such that the effective pressure is more than two times the pressure difference.

Thus, there have been described embodiments of an apparatus, a system and a method of imprint lithography that employ one or more of a predetermined contact area between a mold and a sample, a predetermined cavity area, and a predetermined pressure differential between a chamber enclosing the mold and the sample and an environment outside the chamber to control an effective pressure of imprinting. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. An imprint apparatus comprising:
an imprint mold having a mold pattern, the imprint mold having a contact area that is an area of contact between the mold pattern and a sample; and
a compressible chamber that encloses the imprint mold and the sample, the compressible chamber having a cavity area that is an internal surface area of the compressible chamber contained within a seal of the compressible chamber,
wherein said imprint apparatus is configured to exert a predetermined effective imprint pressure given by a size of said cavity area multiplied by a pressure difference between inside and outside of the chamber and divided by a size of the contact area.

2. The imprint apparatus of claim 1, further comprising:
a first pressure inside the compressible chamber; and
a second pressure outside the compressible chamber,
wherein the value of the compression pressure is given by a value of a pressure difference between the first pressure inside the chamber and the second pressure outside the chamber.

3. The imprint apparatus of claim 1, wherein the compressible chamber comprises:
a first plate, the imprint mold being affixed to the first plate;
a second plate spaced from the first plate, the sample being affixed to the second plate; and
a gasket that bridges a perimeter of a space between the first plate and the second plate, the gasket forming one or both of a gas tight seal and a fluid tight seal between the first plate and the second plate, one or both of the first plate and the second plate being moved together to compress the chamber,
wherein the cavity area comprises an area bounded by the gasket.

4. The imprint apparatus of claim 3, wherein the gasket comprises a compressible material that is impermeable to one or both of a gas and a fluid.

5. An imprint apparatus comprising:
a first plate that supports a mold having a mold pattern and a contact area, the contact area comprising an area of contact between the mold pattern and a sample;
a second plate spaced from the first plate that supports the sample;
a gasket that bridges a space between the first plate and the second plate to form a compressible chamber that encloses the mold and the sample, the compressible chamber having a cavity area within the compressible chamber and bounded by the gasket;
a vacuum within the compressible chamber; and
a pressure external to the compressible chamber,
wherein said imprint apparatus is configured to exert a predetermined effective imprint pressure given by a size of said cavity area multiplied by a pressure difference between inside and outside of the chamber and divided by a size of the contact area.

6. The imprint apparatus of claim 5, wherein the gasket forms one or both of a gas tight seal and a fluid tight seal between the first plate and the second plate when the compressible chamber is compressed.

7. An imprint lithography system comprising:
a contact mask aligner having parallel support plates;
an imprint apparatus supported by the mask aligner, the imprint apparatus having a compressible chamber that houses an imprint mold and a sample, the mask aligner aligning the mold and the sample, the chamber being compressed to imprint a mold pattern of the aligned mold in a surface of the aligned sample; and
a cavity area of the compressible chamber; said imprint apparatus being configured to exert a predetermined effective imprint pressure given by a size of said cavity area multiplied by a pressure difference between inside and outside of the compressible chamber and divided by a size of a contact area between the mold and the sample.

8. The imprint lithography system of claim 7, wherein the pressure that compresses the chamber is provided by a pressure difference between a pressure inside the chamber and a pressure outside the chamber.

9. The imprint lithography system of claim 7 wherein the imprint apparatus comprises a first member, a second member, and a gasket affixed between a perimeter of the first member and the second member when the chamber is compressed, the gasket forming one or both of a gas tight seal and a fluid tight seal between the members, the first member supporting the mold and the second member supporting the sample.

10. The imprint lithography system of claim 9, wherein one or both of the first member and the second member are movable respectively by an action of the supporting mask aligner to align the mold and the sample and to seal the chamber.

11. The imprint lithography system of claim 7, further comprising one or both of means for hardening an imprinted surface of the sample and means for softening a moldable surface of the sample for imprinting.

12. The imprint lithography system of claim 11, wherein the means for hardening and the means for softening independently comprises one or both of a light source and a heat source.

13. An imprint lithography system comprising:
a contact mask aligner having parallel support plates;
an imprint apparatus supported by the mask aligner, the imprint apparatus having a compressible chamber that houses an imprint mold and a sample, the mask aligner aligning the mold and the sample, the chamber being compressed to imprint a mold pattern of the aligned mold in a surface of the aligned sample;
a pressure external to the compressible chamber; and
a vacuum within the compressible chamber,
wherein said imprint apparatus is configured to exert a predetermined effective imprint pressure given by a size of a cavity area of the compressible chamber multiplied by a pressure difference between inside and outside of the compressible chamber and divided by a size of a contact area between the mold and the sample.

14. The imprint lithography system of claim 13, wherein the external pressure comprises one of a gas pressure or a fluid pressure.

15. The imprint lithography system of claim 13, wherein the imprint apparatus comprises a first member, a second member, and a gasket affixed between a perimeter of the first member and the second member when the chamber is compressed, the gasket forming one or both of a gas tight seal and a fluid tight seal between the members, the first member supporting the mold and the second member supporting the sample.

16. The imprint lithography system of claim 15, wherein one or both of the first member and the second member are movable respectively by an action of the mask aligner to align the mold and the sample and to seal the chamber after the vacuum has been introduced into the chamber.

17. The imprint apparatus of claim 2, wherein the first pressure inside the chamber is a vacuum.

18. An imprint apparatus comprising:
a chamber that encloses an imprint mold and a sample, the chamber having a cavity area, the chamber being compressible;
a pressure that is applied to the chamber to compress the chamber, compression providing a contact between the mold and the sample; and
a contact area between the mold and the sample,
wherein said imprint apparatus is configured to exert a predetermined effective pressure between the mold and the sample during imprinting, said predetermined effective pressure being given by a size of said cavity area multiplied by a pressure difference between inside and outside of the chamber and divided by a size of said contact area.

19. The imprint apparatus of claim 18, wherein the applied pressure is provided by a pressure difference between a pressure inside the chamber and a pressure outside the chamber.

20. The imprint apparatus of claim 19, wherein the pressure inside the chamber is a vacuum.

21. An imprint apparatus comprising:
a chamber having a cavity area that encloses an imprint mold and a sample, the chamber being compressible; and
a pressure that is applied to compress the chamber, chamber compression providing a contact between the mold and the sample, the contact having a contact area,
wherein said imprint apparatus is configured to exert a predetermined effective imprint pressure given by a size of said cavity area multiplied by a pressure difference between inside and outside of the chamber and divided by a size of the contact area.

22. The imprint apparatus of claim 21, wherein the chamber comprises a first plate, a second plate spaced from the first plate, and a gasket that bridges a perimeter of a space between the first plate and the second plate, the mold being affixed to the first plate and the sample being affixed to the second plate for imprinting, the gasket forming one or both of a gas tight seal and a fluid tight seal between the first plate and the second plate, one or both of the first plate and the second plate being movable toward one another to compress the chamber, and wherein the applied pressure is provided by a pressure difference between a pressure inside the chamber and a pressure outside the chamber.

23. The imprint apparatus of claim 4, wherein the gasket further comprises a rigid material that provides support to the compressible material of the gasket, the rigid material being thinner than the compressible material to facilitate compression of the compressible chamber.

24. The imprint apparatus of claim 3, wherein one of the first plate movably nests within the second plate and the second plate movably nests within first plate, the gasket slidably sealing between adjacent surfaces of the movably nested first plate and second plate, and wherein the size of the cavity area is a size of a surface area of a surface of the nested one of either the first plate or the second plate that is within the compressible chamber.

25. The imprint apparatus of claim 1, wherein the compression pressure comprises a difference between a pressure of a fluid inside the compressible chamber and a pressure of a fluid outside the compressible chamber.

26. The imprint apparatus of claim 5, wherein one of the first plate movably nests within the second plate and the second plate movably nests within first plate, the gasket slidably bridging between adjacent surfaces of the movably nested first plate and second plate, and wherein the size of the cavity area is a size of a surface area of a surface of the nested one of either the first plate or the second plate that is within the compressible chamber.

* * * * *